United States Patent [19]

Kosonocky

[11] 4,412,343
[45] Oct. 25, 1983

[54] CHARGE TRANSFER CIRCUITS WITH DARK CURRENT COMPENSATION

[75] Inventor: Walter F. Kosonocky, Skillman, N.J.
[73] Assignee: RCA Corporation, New York, N.Y.
[21] Appl. No.: 15,772
[22] Filed: Feb. 28, 1979
[51] Int. Cl.³ .................... G11C 19/28; H01L 29/78
[52] U.S. Cl. .................................... 377/58; 357/24
[58] Field of Search .................... 357/24; 307/221 D

[56] References Cited

U.S. PATENT DOCUMENTS

| | | | |
|---|---|---|---|
| 3,758,794 | 9/1973 | Kosonocky | 357/24 |
| 3,819,954 | 6/1974 | Butler et al. | 357/24 |
| 3,969,634 | 7/1976 | Su et al. | 357/24 |
| 3,983,409 | 9/1976 | Adam | 357/24 |
| 4,134,028 | 1/1979 | Kosonocky et al. | 307/221 D |
| 4,230,952 | 10/1980 | Knauer | 357/24 |

FOREIGN PATENT DOCUMENTS 2542832 3/1977 Fed. Rep. of Germany ........ 357/24
1514653 6/1978 United Kingdom ................. 357/24

OTHER PUBLICATIONS

Levine "Measurement of CCD Transfer Efficiency by Use of Feedback . . . " IEEE J. Solid-State Circuits vol. Sc-8 (4/73) pp. 104–108.

Primary Examiner—Gene M. Munson
Attorney, Agent, or Firm—Joseph S. Tripoli; George J. Seligsohn

[57] ABSTRACT

Dark current compensation is obtained in a charge transfer circuit such as a charge coupled device (CCD) delay line by subtracting from each charge packet, after each predetermined number of shifts of that charge packet, a certain amount of charge. In a preferred form of the circuit, a reference charge packet is periodically introduced into the delay line and the amount of dark current it has accumulated after a given number of shifts is sensed and is employed to determine how much of each charge packet will be periodically removed.

7 Claims, 6 Drawing Figures

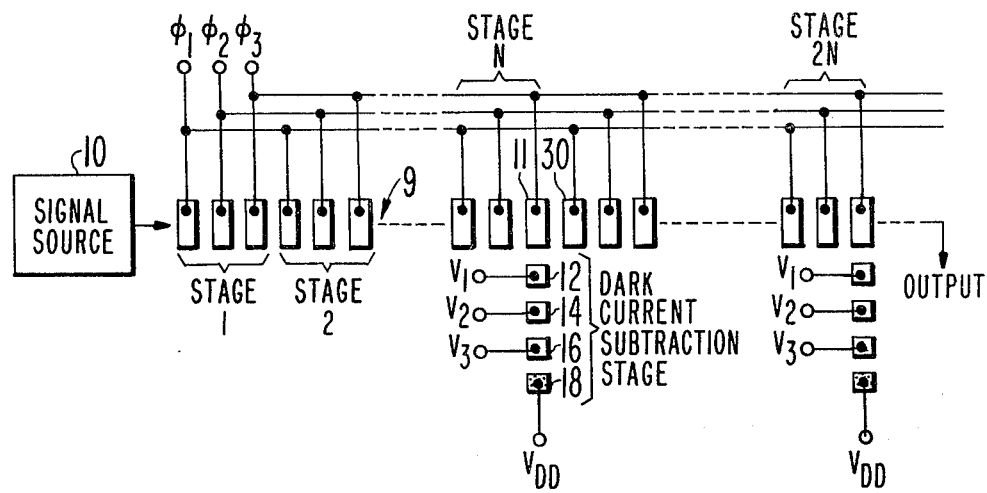
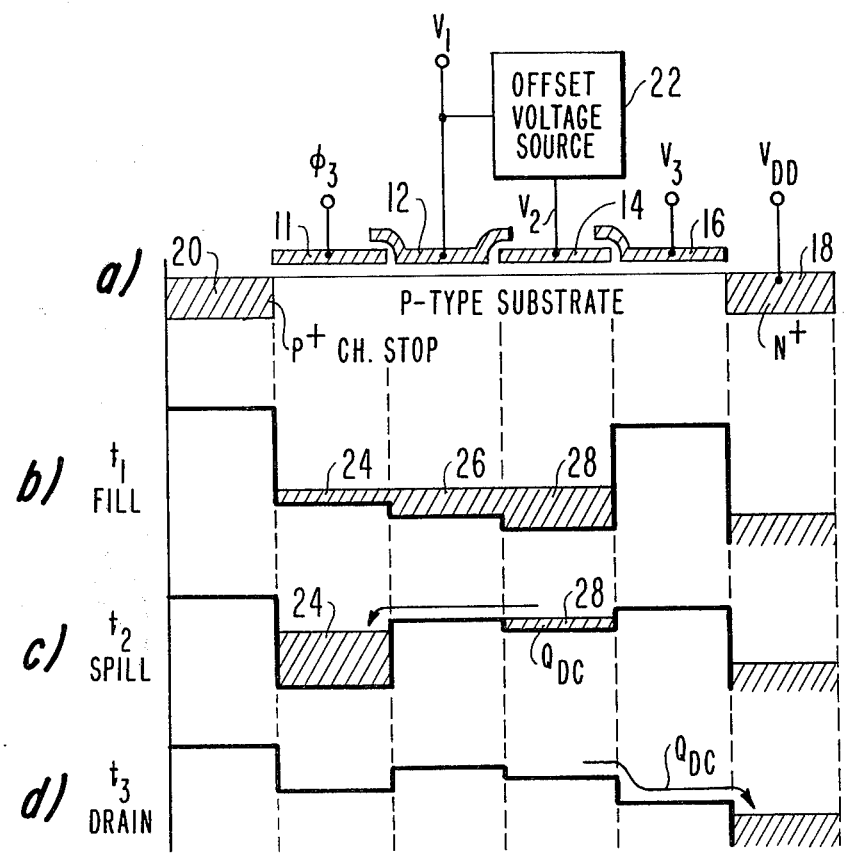
Fig. 1.
Fig. 2.

CHARGE TRANSFER CIRCUITS WITH DARK CURRENT COMPENSATION

The invention described herein was made under a contract with the Department of the Air Force.

The present invention relates to charge transfer devices such as charge coupled devices (CCD's) and in particular, to apparatus for compensating for the effects of dark currents in such devices.

There are a number of constraints which impose a limit on the length of time during which a propagating charge packet can continue to remain intelligible. In the general case, with no special precautions taken, the limit is in the range of about 0.1 and 1.0 second at room temperature. One of the constraints is charge transfer loss (which determines the maximum number of transfers a charge signal can undergo) and another is dark current generation (which is a function of the length of time during which a charge signal is being stored or transferred). The former refers to the amount of charge that is left behind each time a charge signal is shifted from the substrate region beneath one electrode to the substrate region beneath the following electrode. The transfer loss, also referred to as the transfer inefficiency, is small, of the order of $10^{-4}$ to $10^{-5}$ part of the signal, per transfer of charge signal.

The number of times the signal can continue to be transferred can be increased by periodically "refreshing" the signal, say after every N shifts of the signal (N being some large number such as 50 to several hundred to more). This involves changing the signal amplitude to one or two standard levels representing binary 1 and binary 0, respectively, before it has deteriorated to a point at which it is unintelligible. If the signal is an analog signal, transfer losses can be compensated for in the manner discussed in U.S. Pat. No. 4,134,028, issued to W. F. Kosonocky (the present inventor) and D. J. Sauer, on Jan. 9, 1979.

With respect to the second constraint above, namely dark current, as the charge signal propagates along the delay line, it continuously picks up from the substrate spontaneously generated signals known as dark currents. These include one dark current component at a reasonably constant level and sometimes also dark current spikes. The greater the time spent by the charge signal in the substrate, the more dark current it accumulates. The amount of dark current produced also is affected by temperature, dark current increasing with increased temperature, by the quality of the silicon used to fabricate the device, and by the particular processing technique employed for the manufacture.

In a charge transfer device, such as a CCD, embodying the invention, the dark current is compensated for by subtracting from each charge packet after it undergoes a certain number of shifts, a fixed amount of the charge in that packet. The fixed amount to be subtracted may be determined in open loop fashion; however, in a preferred form of the invention, feedback is employed for automatically controlling the amount of charge subtracted. In one arrangement of the latter kind, a charge packet of reference size is introduced into the charge transfer delay line and the amount of dark current it has accumulated is sensed and employed to control the charge subtraction process. In another, in which the CCD is a loop, all of the charge in the loop is integrated and used as a reference and compared with subsequent integrations of charge in the loop. The invention is particularly applicable to a continuously clocked CCD.

In the drawing:

FIG. 1 is a schematic showing of a CCD embodying one form of the invention;

FIG. 2 is a cross-section through a dark current subtraction stage of FIG. 1 and includes surface potential profiles to illustrate the operation of this stage;

Figure 3:
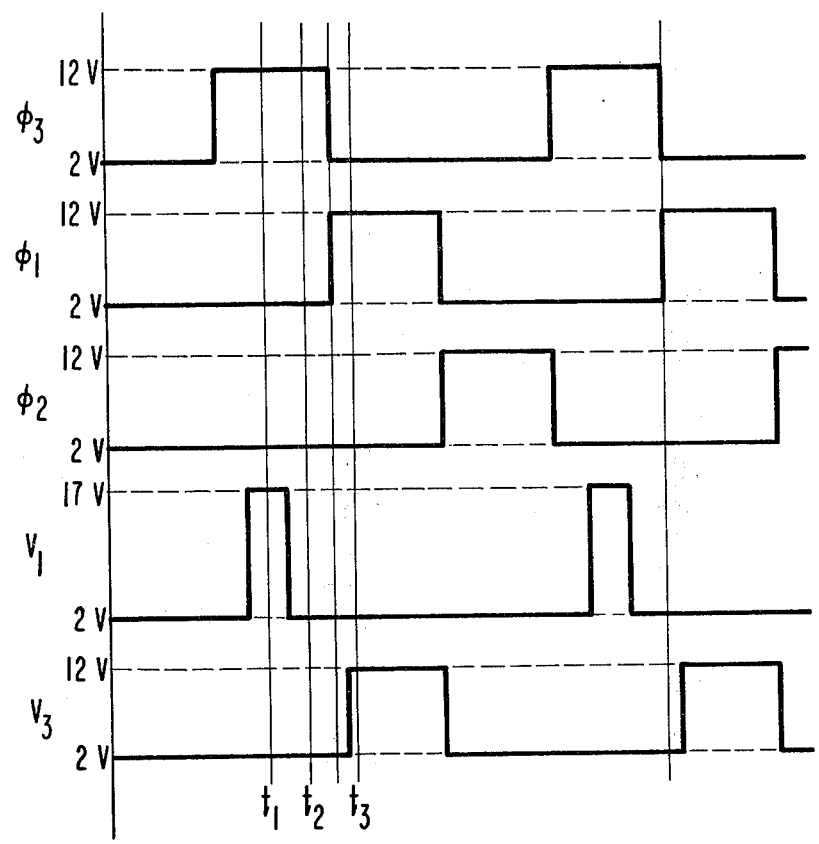
FIG. 3 is a drawing of waveforms employed in the operation of the CCD of FIGS. 1 and 2.

For purposes of the present application, the CCD illustrated is assumed to be an N channel (P-type substrate) CCD of the surface channel type. It is to be understood that the invention is equally applicable to P channel CCD's and to buried channel CCD's of either type. Further, while in a number of cases the CCD's are illustrated schematically, it is to be understood that any of the various well-known gate electrode structures may be employed and any reasonable number of phases may be employed for operation.

Referring now to FIG. 1, the CCD delay line 9 shown (aside from the background subtraction stages) is conventional. A three-phase CCD is illustrated by way of example. The signal source 10 may include a signal voltage source and a means such as a "fill and spill" input circuit for translating the signal to charge packets which represent that signal. The signal is assumed to be an analaog signal. Further, the CCD may include means for compensating for transfer losses such as described in the patent referred to above but is not restricted to such an arrangement.

In the operation of the system of FIG. 1, the charge signal introduced is shifted through the CCD by the application of the multiple phase voltages. As the charge signal progresses along the length of the CCD it picks up more and more dark current signal. If the charge signal remains in the line for a sufficiently long time, the dark current may become such a large part of the charge packet that the information contained therein is completely swamped out and becomes unintelligible.

In the CCD illustrated in FIG. 1, which embodies the present invention there is included at each N'th stage of the register a dark current subtraction stage. N may be some large number such as 100 or 1000 or more and is assumed to be one such that the information contained in the charge packet, at the N'th stage is still quite readable. In general, a dark current subtraction stage should be included at a point (or points) along the CCD delay line at which the dark current component is not more than about one tenth the capacity of a potential well. In a specific example given later, in which the CCD delay line was in the form of a relatively small loop (256 stages) operated at room temperature, there was one dark current subtraction stage for the loop and it subtracted, from each charge packet, during each circulation of that charge packet, a fixed amount of charge equal to a fraction of a percent of the potential well capacity.

The dark current subtraction stage comprises three electrodes 12, 14 and 16 followed by a drain 18. A more realistic showing of such a stage appears at a in FIG. 2. The electrodes illustrated are two-level electrodes with electrode 12, for example, overlapping the edges of the $\phi_3$ electrode 11 of the CCD delay line and the electrode 14. The CCD channel is defined at both edges by channel stops, only one such channel stop 20 being illustrated in FIG. 2. There is a break in the other channel stop at each background subtraction stage to permit the transfer of charge from beneath a $\phi_3$ electrode such as 11 to the dark current subtraction stage. The various electrodes are insulated from the substrate and from one another by insulation such as silicon dioxide; however, to keep the drawing simple, this is not explicitly shown. The drain 18 comprises an N+ diffusion in the P-type substrate and it is held at a relatively positive level $V_{DD}$ so that it can accept the charge carriers shifted thereto which, in this example, are electrons.

The operation of the dark current subtraction stage can be followed with the aid of the surface potential profiles b, c and d of FIG. 2 and the waveforms of FIG. 3. At time $t_1$, $\phi_3$ is high at 12 volts and $V_1$ is high at 17 volts, both with respect to the substrate potential. (These voltages are given by way of example only as actual values will depend upon such parameters as the insulation thickness and so on.) Electrode 14 is at a level $V_2$ which is offset from voltage $V_1$ by an amount determined by the offset voltage source 22. For purposes of the present initial explanation, assume this voltage offset source to be a small battery whose voltage is controllable. The polarity of the voltage offset source 22 is such that the voltage $V_2$ is more positive than $V_1$. Prior to the time $t_1$, $\phi_3$ had gone high and a charge packet had been shifted to the potential well 24. By the time $t_1$, as the potential well 26 created by the voltage $V_1$ had become deeper than potential well 24 and potential well 28 had become still deeper, the charge packet in well 24 had shifted to that part was in well 26 and part in well 28 as illustrated at b in FIG. 2. This part of the figure illustrates the "fill" portion of the fill and spill cycle.

By the time $t_2$, $V_1$ is low at +2 volts while $\phi_3$ remains high at +12 volts. Most of the charge packet has spilled back into potential well 24; however, a small part of the charge packet, $Q_{DC}$, remains in potential well 28. With the offset voltage source properly adjusted, this charge packet $Q_{DC}$ is exactly equal to the dark current charge which has introduced into the signal charge during its propagation from the signal input end of the CCD delay line to the background subtraction stage. All of this is illustrated at c in FIG. 2 and it corresponds to the "spill" part of the cycle.

In the fill and spill method illustrated, $\phi_3$ is kept at a constant level during both parts of the cycle and the charge shifting is effected by pulsing electrodes 12 and 14. As an alternative, with proper electrode design and appropriate voltage levels, $V_1$ and $V_2$ can be fixed and fill and spill effected by first reducing $\phi_3$ to fill well 28 from well 24 and then increasing $\phi_3$ to receive that part of the charge in well 28 which is spilled back into well 24.

At time $t_3$, the signal charge packet has been propagated by the $\phi_1$ voltage, which is now high, to the potential well (not illustrated in FIG. 2) beneath the following electrode 30 (FIG. 1) in the CCD delay line. $V_3$ has gone high to +12 volts and the charge packet $Q_{DC}$ has transferred via the conduction channel present beneath electrode 16 to the drain 18 as illustrated at d in FIG. 2.

The process described above is repeated after each N stages, there being a dark current subtraction stage at each N'th stage of the CCD delay line. In the case of a CCD delay line in the form of a circulating loop, if the loop is sufficiently small, only a single dark current subtraction stage may be needed for the entire loop. In the case of a loop which introduces a very long delay—such that the dark current charge produced will exceed some fixed level such as not more than about 1/10 well of charge during a single circulation around the loop, two or more such stages may be employed. Such a loop may, for example, introduce a delay in the millisecond or tens of milliseconds range.

In the discussion above, the assumption was made that the offset voltage source 22 produced a voltage of value such that the subtraction charge $Q_{DC}$ was equal exactly to the dark current charge which had accumulated. As a general rule, this will not happen without some adjustment. The adjustment can be made manually and preferably, as will be discussed shortly, is made automatically. To perform the adjustment manually in, for example, a CCD loop configuration, one can introduce, during the calibration mode, serially occurring charges of the same fixed amplitude. For example, suppose each charge signal introduced is at a fixed level equal to one tenth well of charge. One can continuously sense the amplitude of this signal as, for example, by translating the signal packet picked up at one point in the loop to a voltage, and displaying that voltage on the screen of an oscilloscope. The oscilloscope can have a trace length (duration) sufficient to display say ten round trips of that signal through the loop. If, upon observation on the screen, it is noted that the signal amplitude is decreasing during successive circulations through the loop, this is an indication that the amount of charge signal $Q_{DC}$ subtracted is too large. Conversely, if the charge signal sensed increases during successive circulations around the loop, then $Q_{DC}$ is too small. By controlling the adjustment of offset voltage source 22 to a value such that the charge signal remains of constant amplitude during successive traversals around the loop on can be certain that $Q_{DC}$ is substantially equal to the dark current introduced.

The adjustment described above assumes that the transfer losses are low. This assumption is valid when employing the charge compensation circuit described in the patent referred to above. This assumption also is valid for the case in which the number of transfers in the loop are such that the transfer losses are small during N circulations being observed on the screen of the oscilloscope.

Figure 4:
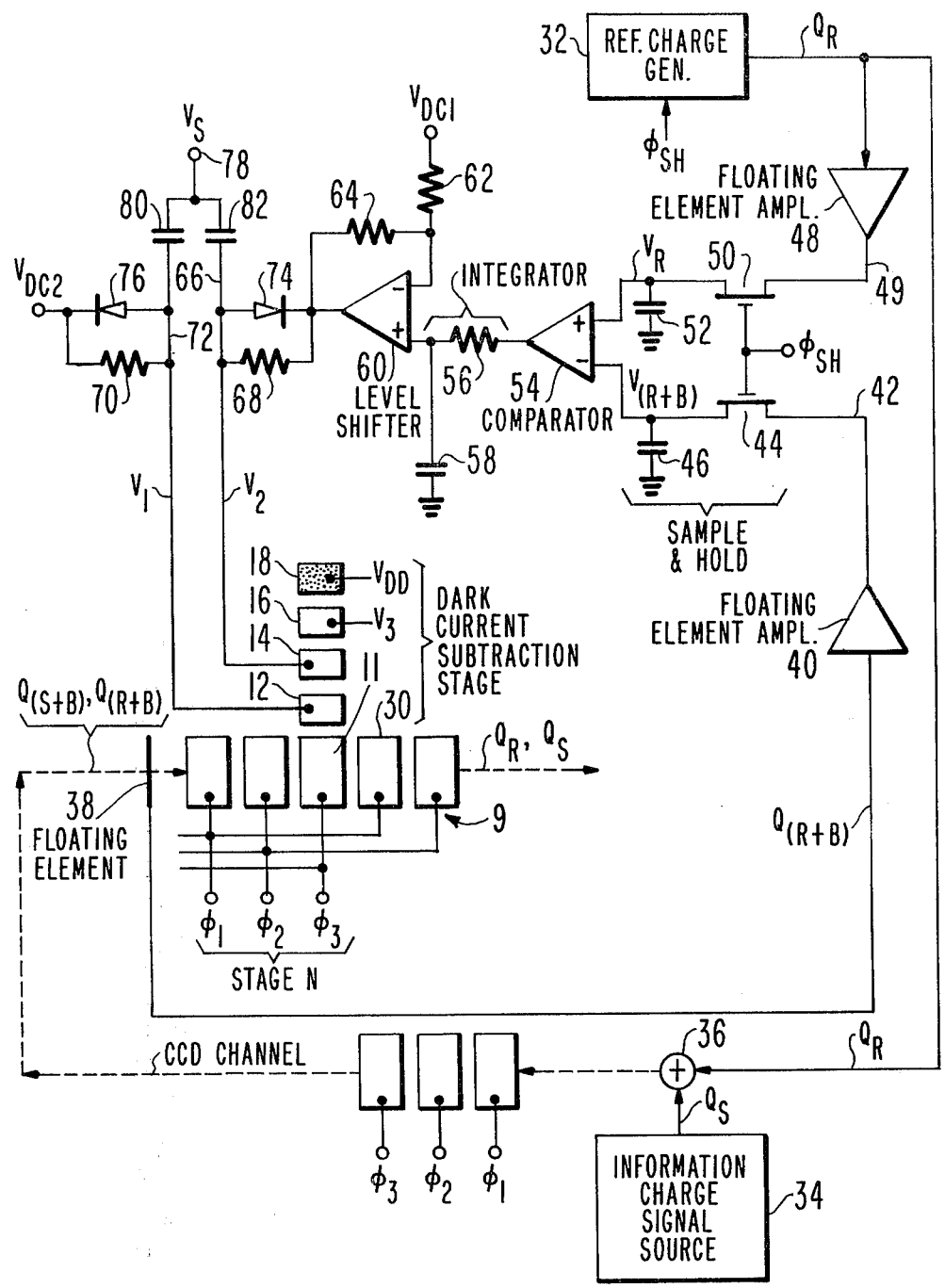
FIG. 4 is a schematic diagram of a circuit for automatically controlling the voltage applied to the background subtraction stage.

A circuit for automatically providing the offset voltage between electrodes 12 and 14 of FIG. 1 is illustrated in FIG. 4. It includes a reference charge generator 32 which produces a charge at a reference level such as equal to that which will occupy half a potential well in the CCD delay line. The CCD delay line is assumed to have a standard channel width and the electrodes to have a standard length. The channel width is the dimension between the channel stops at the channel edges and the electrode length is the electrode dimension in the charge propagation direction. To produce a reference charge at a half well level, one can use a standard input circuit such as one of the fill and spill type, a channel which is half the width of the channel of the CCD delay line and a signal voltage equal to that which would be used to produce a full well of charge in the main channel of the CCD delay line.

Assuming that a dark current subtraction stage occurs every N stages in the CCD, then one reference charge packet $Q_R$ is produced for every N-1 signal charge packets. This reference charge packet is clocked by the pulse $\phi_{SH}$ which is at a frequency (1/N)'th that of a three-phase clock pulse such as $\phi_1$. The reference charge packet $Q_R$ can be timed so that it is the first occurring charge packet and it will be followed by N-1 serially occurring signal charge packets.

The information charge signal source is shown schematically at 34. In the example given, this too may be a fill and spill input circuit and signal voltages employed to produce the signal charge packets may be analog or digital in nature. The signal charge packets $Q_S$ and the reference charge packets $Q_R$ are applied to summer 36 and from there are introduced into the CCD. The summer may simply be the point at which the two CCD channels, one carrying the reference charge packets and the other the information signal charge packets, converge. As the charges $Q_S$ and $Q_R$ occur during different (mutually exclusive) time periods, the summer does not add them to one another but merely serves to introduce the respective charge packets, in a serial stream, into the CCD delay line.

Each reference charge packet followed by a group of signal charge packets propagate down the CCD and they both accumulate dark currents in the process. A floating charge pickup element, illustrated schematically at 38, is located in front of and close to the background subtraction stage. In this particular application this element preferably is a floating gate electrode rather than a floating diffusion as it is not as lossy as a floating diffusion. The floating element is connected to a floating element amplifier 40 which senses the charge signal present at the floating element and produces an output voltage representative thereof at its output lead 42. The floating element amplifier illustrated is one of the non-inverting type. For example, it may be a source-follower amplifier with the gate electrode of the source-follower transistor driven by the floating element and with a reset circuit connected to the floating element for returning the same to a reference level after each charge sensing interval.

When the reference charge reaches the floating element, it is seen by the element as a charge $Q_{(R+B)}$, where the subscript R+B indicates that the charge signal has accumulated background charge (dark current) during the course of its transmission down the CCD delay line. The corresponding voltage present at output 42 of the amplifier 40 is applied to the source electrode of a field effect transistor 44. This transistor is turned on by clock voltage $\phi_{SH}$ at the time the charge $Q_{(R+B)}$ is being sensed by the floating element and the current passing through this transistor charges the capacitor 46 to a voltage level $V_{(R+B)}$.

At the same time that the above is occurring, the reference charge generator 32 is producing the following reference charge packet $Q_R$. This is supplied to the floating element amplifier 48 and its output causes a current to flow through transistor 50 which is turned on also by the voltage $\phi_{SH}$. Accordingly, the capacitor 52 becomes charged to a voltage level $V_R$ corresponding to the reference charge level $Q_R$. Upon the termination of the clock $\phi_{SH}$, transistors 44 and 50 turn off and the capacitors 46 and 52 retain the charge levels to which they have been set. As indicated in the drawing, each transistor-capacitor circuit, in effect, comprises a sample-and-hold circuit and each stores the charge and therefore the voltage level at which it is placed during the interval of the clock pulse $\phi_{SH}$, for the period between successive such clock pulses $\phi_{SH}$.

The voltages $V_R$ and $V_{(R+B)}$ are supplied to a differential amplifier operating as a comparator 54. Its output is proportional to the difference between the two voltages $V_R$ and $V_{(R+B)}$ and this difference is integrated by the RC integrator 56, 58. This integrator applies a DC voltage level to the non-inverting input of a differential amplifier which operates as a level shifter 60. The second input to the differential amplifier comprises a DC level $V_{DC1}$ which is applied through resistor 62 to the inverting input of the level shifters. Resistor 64 connected between the output and inverting input terminals of the level shifter operates as a feedback circuit. The level shifter, its feedback resistor 64 and resistor 62 apply a DC voltage to the conductor 66. The direct voltage level produced by the integrator 56, 58 adds a voltage component to the voltage at 66.

The voltage $V_{DC2}$ is applied through resistor 70 to conductor 72. The diodes 74 and 76 operate as clamps and prevent the voltages at conductors 66 and 72 from exceeding (by more than one diode drop) the positive voltage levels at the cathodes of the respective diodes.

In the operation of the circuit of FIG. 4, a voltage $V_S$ which is a pulse type voltage wave of a shape similar to that of $V_1$ of FIG. 3, is applied from terminal 78 through coupling capacitors 80 and 82 to conductors 72 and 66. The clamping circuits, including the diodes 74 and 76, capacitors 80 and 82, and resistors 68 and 70, translate the voltage $V_S$ to a corresponding waveform between desired limits on lines 72 and 66. In response to the positive pulses $V_S$, conductor 72 is driven between +2 and +17 volts and conductor 66 is driven from a voltage level which, in general, may be somewhat higher than +2 volts to the voltage level at the output of the level shifter which, in general, may be somewhat higher than 17 volts (assuming a 15 volt swing for $V_S$).

For purpose of the present explanation, assume that the charge $Q_R$ has accumulated no background charge (due to the dark current) during its propagation from the input to the delay line 36, to the floating element 38 which is immediately ahead of the stage of the CCD to which the background subtraction stage is coupled. The charge $Q_{(R+B)}$ which is sensed by the floating element will, in this case, be equal to $Q_R$. Accordingly, at the time the clock pulse $\phi_{SH}$ is produced, the voltage at output 42 of amplifier 40 will be equal to the voltage produced at the output lead 49 of amplifier 48. Thus, the capacitors 46 and 52 of the two sample-and-hold circuits will be charged to the same value and the voltage $V_R$ and $V_{(R+B)}$ will be equal. Accordingly, the output of comparator 54 will be zero and the output produced by the level shifter 60 will be $V_{DC1}$, assuming the resistor 64 to be equal in value to the resistor 62. This output, in the example given, may be somewhat lower than $V_{DC2}$ because the threshold of gate electrode 14 (a lower level electrode) may be somewhat lower than that of upper level electrode 12. Therefore, $V_{DC2}$, the DC level applied to conductor 72, may be somewhat lower than that applied to conductor 66. The difference is such that when the $V_S$ pulse occurs, $V_1$ and $V_2$ will produce beneath electrodes 12 and 14 equal substrate potentials during the fill and spill process illustrated in FIG. 2, no charge $Q_{DC}$ will be subtracted from the charge packets which pass beneath the $\phi_3$ electrode 11.

If, as will normally be the case, the charge $Q_{(R+B)}$ sensed by the floating element amplifier 40 is of greater amplitude than the charge $Q_R$ sensed by the floating element amplifier 48, then there will be an offset between the voltage levels $V_1$ and $V_2$ such that the substrate potential 28 (FIG. 2) will be greater than that at 26, as shown in FIG. 2. In brief, the difference in charge levels between $Q_R$ and $Q_{R+B}$ will result in a larger voltage $V_{(R+B)}$ across capacitor 46 than the voltage $V_R$ across capacitor 52. The comparator 54 will sense the voltage difference and the integrator 56, 58 will cause a voltage proportional thereto continuously to be applied to the non-inverting input terminal of the level shifter 60. As a result, the voltage at the output of the level shifter will be some value $V_{DC1} + \Delta V$, where $\Delta V$ is proportional to the background charge level (due to the dark current generation) superimposed on the reference charge $Q_R$ at the time it is sensed by the floating element 38.

The voltage $V_{DC1} + \Delta V$ is applied through resistor 68 to the conductor 66 so that this conductor is more positive than the voltage $V_{DC2}$ on the conductor 72. Accordingly, when pulse $V_S$ occurs, there is a corresponding offset between the voltage pulses applied to electrodes 12 and 14, respectively. This offset causes the dark current subtraction stage to remove a fixed amount of charge $Q_{DC}$ from the charge $Q_{(R+B)}$ *and from each of the $N-1$ signal charge packets following this charge $Q_{(R+B)}$*. The fixed amount of charge $Q_{DC}$ is proportional to the voltage difference $\Delta V$ and is independent of the amplitude of the signal charge packets (which, in general, will differ in amplitude from one another).

If $Q_{(R+B)}$ at a dark current subtraction stage happens to be larger than $Q_R$, because at the previous subtraction stage (in the case of a long delay line) or in the previous cycle (in the case of a loop) too much charge was subtracted, the resulting correction voltage will be negative ($-\Delta V_1$) and proportional to $Q_{(R+B)} - Q_R$. In this case, no charge will be subtracted from the signal charge at the dark current subtraction stage.

As should be clear from the explanation above, the feedback system described continuously maintains the voltage offset between lines 72 and 66 at the precise level required to subtract the background charge which accumulates during the propagation of charge signals along the CCD.

The magnitude of the capacitance 58 and the resistance 56 of the integrator determine the time constant of the integrator. This time constant is chosen to be sufficiently large to avoid oscillations in the feedback system, that is, to keep the system stable. Should some parameter, such as temperature, change, it will affect the amount of background signal which is generated. This, in turn, will automatically correct the offset voltage between electrodes 12 and 14 in a sense and amount to compensate for the change in generated dark current.

FIG. 4 illustrates specific structures for performing the functions specified. It is to be understood these are intended as examples only because many alternatives are possible. For example, the integrator, while illustrated as an RC integrator, may be one of another type. Also, in some cases several of the functions can be combined and performed in a single integrated circuit which may be on the same chip as the CCD.

The CCD delay line illustrated may simply be a register with one or more subtraction stages such as shown spaced along the length of the register. Alternatively, the line may be a closed loop with the output end connected to the summer 36 for supplying charge packets through the summer to the input end of the line.

In the embodiment of the invention illustrated, a single reference charge packet $Q_R$ is introduced for every N-1 signal charge packets. Such a system is suitable where the transfer losses are small. If transfer losses are appreciable, it may be advantageous to introduce at 32, a group of serially occurring reference charge packets $Q_R$, such as say five such charge packets, at a time for each group of N-5 signal charge packets. In this case, the third one of the charge packets, call it $Q_{R3}$, may be selected as the reference and compared with the third such packet $Q_{(R+B)3}$ picked up at 38. The placement of the reference charge packet $Q_{R3}$ in the center of a group of such packets compensates, in a sense, for the transfer losses it suffers as it will tend to pick up loss charges from the preceding charge packet which will roughly equal the charges it loses to the following charge packets.

In the case in which the CCD delay line 9 is one with transfer loss compensation such as described in U.S. Pat. No. 4,134,028 mentioned above, and in which each signal charge packet is followed by a trailing fat zero (see, for example, FIG. 7 of the patent), it is preferred that the dark current be subtracted not from the signal charge packet, but rather from the trailing fat zero. It is advantageous to operate in this way as the trailing fat zeros are of uniform size and the fixed amount of charge subtracted will be more uniform from one fat zero to the next than if the subtracted charge is taken from the signal charge packet which may vary in size from one such packet to the next. Note that the trailing fat zero periodically is combined with and then separated at a reference level from the signal charge packet it is trailing so that the subtraction of the background charge from the fat zero charge packet is translated into a correction to the signal charge packet at the charge combining stage.

Figure 5:
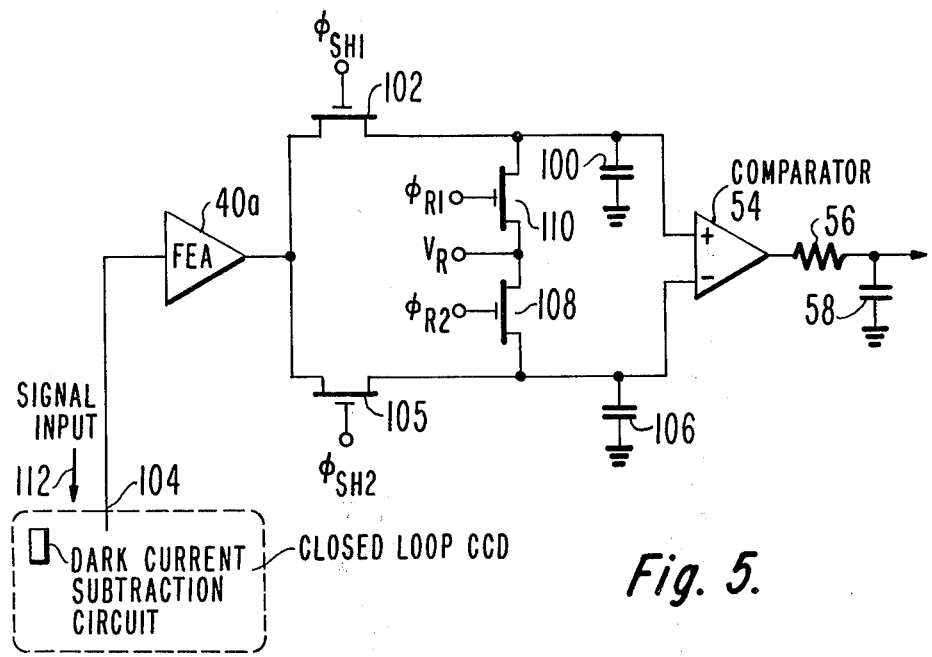
FIG. 5 illustrates a modification to the circuit of FIG. 4 which is advantageously employed with a closed loop CCD.

FIG. 5 illustrates an embodiment of the invention which is especially suitable for use with a closed loop CCD. The advantage of this arrangement is its economy. It requires only a single floating element amplifier 40a in place of the two floating element amplifiers of FIG. 4. FIG. 5 illustrates only the portion of the circuit through the integrator, the remainder of the circuit being the same as shown in FIG. 4.

In the operation of the embodiment of FIG. 5, the reference charge present in the closed loop is translated to a voltage by the floating element amplifier 40a and the voltage is employed to charge the capacitor 100 through the field effect transistor 102. This field effect transistor is normally off but is turned on by the clock pulse $\phi_{SH1}$ which occurs during the time the reference charge is being sensed by the floating element 104, which is preferably a floating gate. The clock pulse $\phi_{SH1}$ occurs say the first time a reference charge $Q_R$ appears and thereafter remains off for some large number of circulations of the reference charge through the loop such as 10, 50 or 100 or more, depending on such parameters as the length of time the capacitor 100 can store a charge without substantial deterioration.

The pulse $\phi_{SH2}$ occurs each subsequent time the reference charge is sensed by the floating gate 104. For example, in the case in which the charge stored in capacitor 100 is updated each one hundred traversals of the closed loop CCD, then the frequency of $\phi_{SH2}$ will be one hundred times that of $\phi_{SH1}$. $\phi_{SH2}$ is concurrent with the sensing of a reference charge by the floating element 104, and it turns on field-effect transistor 105. The capacitor 106 thereupon is charged through the transistor 105 to a level proportional to the reference charge amplitude which will include a component proportional to dark current. The comparator 54 compares the charge stored in capacitor 100, which charge is used as a reference, with the charge stored in capacitor 106 to produce a correction signal. The latter is integrated at 56, 58 and is employed to control the voltage offset between electrodes 12 and 14 of a background subtraction circuit coupled to the closed loop CCD in the manner already discussed in connection with FIG. 4.

A short time after the stored charges are compared and before the following $\phi_{SH2}$ pulse occurs, $\phi_{R2}$ occurs and it turns on field effect transistor 108. The voltage $V_R$ thereupon resets the capacitor 106 to the reference voltage level $V_R$. This process continues until it is desired to refresh the reference voltage level present on capacitor 100. Prior to refreshing, the voltage $\phi_{R1}$ occurs. This turns on transistor 110 so that capacitor 100 is reset to the reference voltage $V_R$. Immediately thereafter $\phi_{R1}$ goes off and $\phi_{SH1}$ goes on coincidentally with the presence of a reference charge $Q_R$ at the floating gate 104. This new reference charge may be one that has just been inserted into the closed loop at the signal input point 112.

Figure 6:
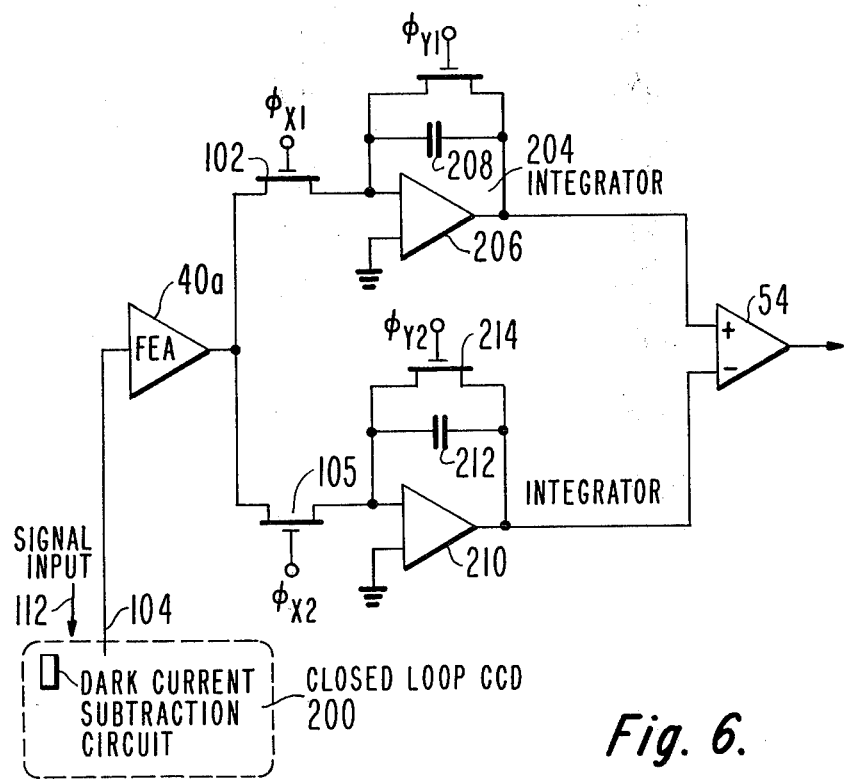
FIG. 6 illustrates a second modification of the circuit of FIG. 4.

In the embodiment illustrated in FIG. 6, the entire contents of the closed loop CCD during one circulation around the CCD is integrated and employed as a reference and is compared with the integral of succeeding groups of such signals. The transistor 102 is turned on by the pulse $\phi_{X1}$ for an interval equal to the time required for a charge packet to circulate around the entire closed loop CCD 200. The successive charges sensed at 104 are translated to voltages at 40a and the corresponding currents passing through transistor 102 are integrated by the integrator 204. The latter comprises an operational amplifier 206 and a capacitor 208 operating as a feedback circuit between the input and the output of the amplifier.

Upon termination of the pulse $\phi_{X1}$, the capacitor 208 is storing a charge proportional to the integral of all of the charges picked up during one circulation through the loop. During the next circulation through the loop 202, $\phi_{X2}$ goes on turning on transistor 105 and the integrator 210, 212 integrates the corresponding currents it receives. Pulse $\phi_{X2}$ then turns off for a short interval and comparator 54 compares the charge stored on capacitor 212 with the reference charge stored on capacitor 208 and produces a difference voltage which is applied to the succeeding circuits in the same way as has already been discussed. This difference voltage determines the voltage offset between electrodes 12 and 14 of the background subtraction stage as discussed in connection with FIG. 4.

After the comparison is made at 54, $\phi_{Y2}$ goes on for a short period and turns on transistor 214 so as to discharge the capacitor 212. $\phi_{X2}$ thereupon goes off and $\phi_{X2}$ goes on again so that the process may be repeated for the following circulation of charges through the closed loop 200. This process continues for a length of time which is dependent on, for example, how long the integrator 204 can retain the reference charge at the reference level. If, for example, the time is equivalent to that required for 100 traversals around the loop, then after that time, $\phi_{Y1}$ goes on to reset the integrator 204. During the following circulation through the closed loop, $\phi_{X1}$ will go on to establish a new reference voltage level across capacitor 208 and then go off and thereafter the process will repeat in the manner which has been discussed.

The principles of the present invention have been tested by employing a 256 stage, buried channel, closed loop CCD. This CCd was operated using a transfer loss compensation circuit of the type discussed in the above-identified patent and using a background subtraction circuit in which the offset voltage was adjusted by hand in the manner discussed in connection with FIGS. 1 and 2. The tests showed that with the dark current subtractor removing the thermally generated (the dark current) charge from the loop, the noise level tended to saturate at a relatively low value with a net reduction of signal to noise (S/N) by only about 3 dB, that is, from the original value of 57 dB to a final saturated value of 54 dB. With the described dark current subtractor in the loop, the duration of time the signal can be maintained in the loop is increased by a factor of 10 to 1000 or more. In fact, if there were no transfer losses, it is believed the signal could be maintained indefinitely. In one test, the closed loop was operated at 140 kHz for one entire minute. During this period there were 32,814 circulations around the loop. Each charge packet of interest underwent $1.68 \times 10^7$ charge transfers and each such charge packet, had removed therefrom, a total of 120 wells of background charge. Similar results were achieved at 2 MHz, that is, circulation of charge for one minute was achieved, with no appreciable increase in dark current after a given dark level current was reached.

In a typical CCD operated at room temperature, a full well of dark current charge is generated at room temperature in about a second or so (although in the particular CCD tested above, a full well of dark current charge accumulated in ½ second). For every increase in temperature by about 10° C., the dark current generated doubles. In some devices, the dark currents generated are much higher due to local dark current spikes (in some cases by a factor of 100).

What is claimed is:

1. In a charge coupled device (CCD) delay line which includes a semiconductor substrate, electrodes insulated from the substrate to which multiple phase voltages are applied for creating potential wells in the substrate for the storage and propagation of signal charge packets along the length of the delay line, and in which dark current charges are produced which add to the charge packets as they are being propagated along the delay line, a system for reducing the effect of the dark current charge comprising:

means coupled to said CCD delay line for subtracting from each signal charge packet, after it has accumulated a fixed amount of dark current charge, not greater than a relatively small fraction of the capacity of one of said potential wells, said fixed amount of charge and for disposing of the subtracted charge, said means comprising:

M second CCD's coupled to said delay line, where M is an integer equal to at least 1, each such second CCD being located at a point along said CCD delay line at which a charge packet arrives after it has accumulated said fixed amount of dark current charge, each such second CCD comprising:

means including two electrodes coupled to a common voltage source and with a fixed offset voltage between them for creating a potential well in said substrate;

means for propagating each charge packet reaching said second CCD to said potential well;

means for returning all except said fixed amount of said charge in said well to said CCD delay line;

a drain; and means for shifting said fixed amount of charge to said drain.

2. In a CCD as set forth in claim 1, further including:

means for sensing said fixed amount of dark current charge picked up by a charge packet; and means responsive to said sensing means for controlling the amount of charge subtracted from each charge packet by said means for subtracting.

3. In a charge coupled device (CCD) delay line which includes a semiconductor substrate, electrodes insulated from the substrate to which multiple phase voltages are applied for creating potential wells in the substrate for the storage and propagation of charge packets along the length of the delay line, and in which dark currents are produced which add to the charge packets as they are being propagated along the delay line, a system for reducing the effect of the dark current comprising:

means for introducing into said delay line a reference charge packet followed by a plurality of signal charge packets;

means for producing a first voltage indicative of the reference charge packet amplitude and a second voltage indicative of the reference charge packet amplitude after it has undergone X shifts and has increased in amplitude by virtue of the dark current charge it has picked up during said X shifts, where X is an integer sufficiently large that the dark current is at least a fraction of a percent of the capacity of a potential well;

means for comparing said first and second voltages and for producing and storing a third voltage indicative of the difference in amplitudes between said first and second voltages; and means responsive to said third voltage for subtracting from each charge packet, after said X shifts thereof, an amount of charge substantially equal to the background charge it has accumulated during said X shifts.

4. In a charge coupled device (CCD) delay line which includes a semiconductor substrate, electrodes insulated from the substrate to which multiple phase voltages are applied for creating potential wells in the substrate for the storage and propagation of signal charge packets along the length of the delay line, and in which dark current charges are produced which add to the charge packets as they are being propagated along the delay line, a system for reducing the effect of the dark current charge comprising:

means coupled to said CCD delay line for subtracting from each signal charge packet, after it has accumulated a fixed amount of dark current charge, not greater than about one tenth of the capacity of one of said potential wells, said fixed amount of charge and for disposing of the subtracted charge, said means M second CCD's coupled to said delay line, where M is an integer equal to at least 1, each such second CCD being located at a point along said CCD delay line at which a charge packet arrives after it has accumulated said fixed amount of dark current charges, each such second CCD comprising:

means for creating a potential well in said substrate;

means for propagating each charge packet reaching said second CCD to said potential well;

means for returning all except said fixed amount of said charge in said well to said CCD delay line;

a drain;

means for shifting said fixed amount of charge to said drain;

means for sensing said fixed amount of dark current charge picked up by a charge packet;

means responsive to said sensing means for controlling the amount of charge subtracted from each charge packet by said means for subtracting;

means for introducing into said CCD delay line, for each group of N serially charge packet, a reference charge packet, where N is an integer which is such that the reference charge packet will accumulate said fixed amount of dark current during the period it is being shifted in the delay line between successive introductions of said reference charge packet; and wherein said means for sensing comprises means for comparing the amplitude of a reference charge packet with that of a second reference charge packet which has been shifted along said CCD delay line for said period of time, for producing an output proportional to the difference between the two.

5. In a charge coupled device (CCD) delay line which includes a semiconductor substrate, electrodes insulated from the substrate to which multiple phase voltages are applied for creating potential wells in the substrate for the storage and propagation of charge packets along the length of the delay line, and in which dark currents are produced which add to the charge packets as they are being propagated along the delay line, a system for reducing the effect of the dark current comprising:

means for introducing into said delay line a plurality of signal charge packets for propagation along said delay line;

means for producing and storing a first voltage indicative of the amplitude of at least one of said charge packets at a reference time and a second voltage indicative of the amplitude of said at least one charge packet at a second time after it has undergone X shifts and has increased in amplitude by virtue of the dark current charge it has picked up during the period between said reference and said second times, where X is an integer equal to at least 50 and where said period is sufficiently large that the dark current is at least a fraction of a percent of the capacity of a potential well;

means for comparing said first and second voltages and for producing and storing a third voltage indicative of the difference in amplitudes between said first and second voltages;

means responsive to said third voltage for subtracting from at least certain of said charge packets, after each said X shifts thereof, an amount of charge substantially equal to the background charge each has accumulated, during said X shifts, and wherein:

said CCD delay line comprises a closed loop, said means for producing and storing a second voltage comprising means for integrating all of the charge packets in said loop during one circulation through the loop, and said means for producing and storing a second voltage comprising means for integrating all of the charge packets in said loop during at least a following circulation through the loop.

6. In a charge coupled device (CCD) delay line which includes a semiconductor substrate, electrodes insulated from the substrate to which multiple phase voltages are applied for creating potential wells in the substrate for the storage and propagation of charge packets along the length of the delay line, and in which dark currents are produced which add to the charge packets as they are being propagated along the delay line, a system for reducing the effect of the dark current comprising:

means for introducing into said delay line a plurality of signal charge packets for propagation along said delay line;

means for producing and storing a first voltage indicative of the amplitude of at least one of said charge packets at a reference time and a second voltage indicative of the amplitude of said at least one charge packet at a second time after it has undergone X shifts and has increased in amplitude by virtue of the dark current charge it has picked up during the period between said reference and said second times, where X is an integer equal to at least 50 and where said period is sufficiently large that the dark current is at least a fraction of a percent of the capacity of a potential well;

means for comparing said first and second voltages and for producing and storing a third voltage indicative of the difference in amplitudes between said first and second voltages;

means responsive to said third voltage for subtracting from at least certain of said charge packets; after each said X shifts thereof, an amount of charge substantially equal to the background charge each has accumulated during said X shifts, and wherein:

said charge packets are arranged in groups, each such group representing a signal and said means for subtracting comprises means for subtracting an amount of charge substantially equal to the background charge from only one charge packet in each group of said charge packets.

7. In a CCD delay line as set forth in claim 6, each group of charge packets comprising a signal charge packet followed by a fat zero charge packet, the fat zero charge packets being of uniform size, and wherein said means for subtracting comprises means for subtracting from the fat zero charge packet in each group.

* * * * *

UNITED STATES PATENT AND TRADEMARK OFFICE
CERTIFICATE OF CORRECTION

PATENT NO. : 4,412,343
DATED : October 25, 1983
INVENTOR(S) : Walter Frank Kosonocky It is certified that error appears in the above-identified patent and that said Letters Patent is hereby corrected as shown below:

Column 3, line 40, "to" should be --so--.

Column 4, line 45, "on" should be --one--.

Column 9, line 58, "$\phi_{X2}$" should be --$\phi_{Y2}$--.

Column 10, line 6, "CCd" should be --CCD--.

Column 11, line 61, after "means" insert --comprising--.

Signed and Sealed this

Twenty-fourth Day of January 1984

[SEAL]

Attest:

GERALD J. MOSSINGHOFF

Attesting Officer

Commissioner of Patents and Trademarks